United States Patent
Shimura

(10) Patent No.: US 9,171,637 B2
(45) Date of Patent: Oct. 27, 2015

(54) NONVOLATILE SEMICONDUCTOR MEMORY DEVICE AND METHOD OF CONTROLLING THE SAME

(71) Applicant: Kabushiki Kaisha Toshiba, Minato-ku (JP)

(72) Inventor: Yasuhiro Shimura, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 8 days.

(21) Appl. No.: 14/162,970

(22) Filed: Jan. 24, 2014

(65) Prior Publication Data

US 2015/0063032 A1    Mar. 5, 2015

Related U.S. Application Data

(60) Provisional application No. 61/870,302, filed on Aug. 27, 2013.

(51) Int. Cl.
  *G11C 16/06* (2006.01)
  *G11C 16/34* (2006.01)

(52) U.S. Cl.
  CPC .................................. *G11C 16/3459* (2013.01)

(58) Field of Classification Search
  CPC ............... G11C 16/0483; G11C 16/04; G11C 16/3454; G11C 7/22; G11C 16/3459; G11C 11/5628; G11C 2211/5621; G11C 16/16; G11C 16/3436
  USPC ............. 365/230.03, 185.17, 185.19, 185.03, 365/185.11, 185.22
  See application file for complete search history.

(56) References Cited

U.S. PATENT DOCUMENTS

| 7,558,117 | B2 | 7/2009 | Maejima et al. |
| 7,663,932 | B2 | 2/2010 | Hamada et al. |
| 2009/0323432 | A1* | 12/2009 | Futatsuyama et al. ... 365/185.22 |
| 2010/0232233 | A1 | 9/2010 | Futatsuyama et al. |

FOREIGN PATENT DOCUMENTS

| JP | 2009-158079 | 7/2009 |
| JP | 4846814 | 12/2011 |
| JP | 5148355 | 2/2013 |

* cited by examiner

*Primary Examiner* — Thong Q Le

(74) *Attorney, Agent, or Firm* — Oblon, McClelland, Maier & Neustadt, L.L.P.

(57) ABSTRACT

This nonvolatile semiconductor memory device comprises: a word line connected to a control gate; a bit line electrically connected to one end of a NAND cell unit; a source line electrically connected to the other end of the NAND cell unit; and a control circuit that controls a voltage applied to a semiconductor layer, the control gate, the bit line, and the source line.

The control circuit is configured to, when performing a write verify operation for determining whether a write operation has been completed or not after finishing the write operation, temporarily raise a voltage of the bit line or the source line to a light erase voltage which is higher than a voltage applied to the bit line or the source line during the write verify operation.

14 Claims, 9 Drawing Sheets

FIG. 2
Lower Page PRG
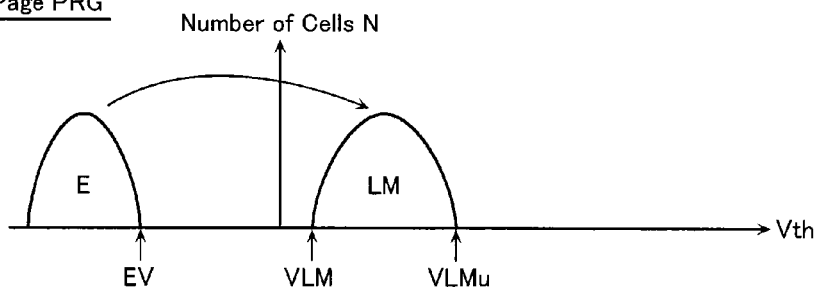
Upper Page PRG
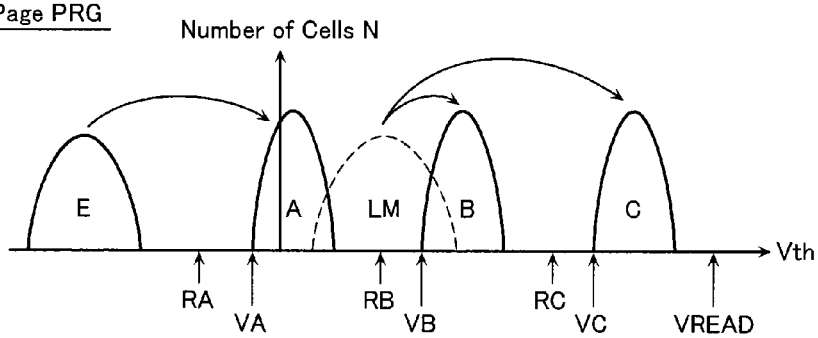
FIG. 3
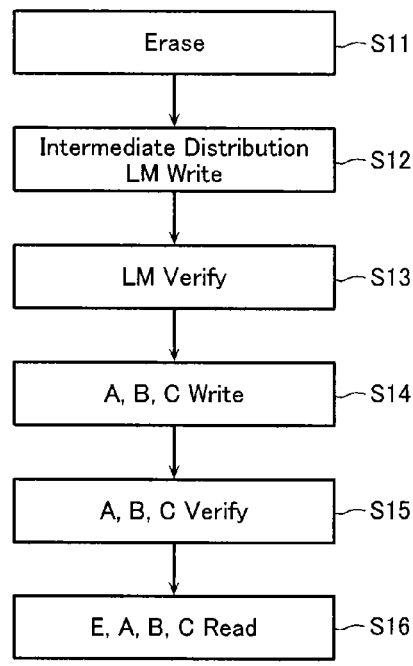

NONVOLATILE SEMICONDUCTOR MEMORY DEVICE AND METHOD OF CONTROLLING THE SAME

CROSS REFERENCE TO RELATED APPLICATIONS

This application is based on and claims the benefit of priority from prior US prior provisional Patent Application No. 61/870,302, filed on Aug. 27, 2013, the entire contents of which are incorporated herein by reference.

FIELD

This invention relates to a nonvolatile semiconductor memory device and a method of controlling the same.

BACKGROUND

A cell array of a NAND type flash memory is configured as an arrangement of NAND cell units, each NAND cell unit having a plurality of memory cells connected in series therein. The two ends of each NAND cell unit are respectively connected to a bit line and a source line via a select gate transistor.

Control gates of the memory cells in the NAND cell unit are each connected to a different word line. The NAND type flash memory has a plurality of memory cells connected in series sharing a source and a drain, moreover, has the select gate transistors and their bit line contacts and source line contacts and so on shared by the plurality of memory cells, hence a size of a unit memory cell can be reduced, and, moreover, since a shape of the word line or an element region of the memory cell is close to a simple striped shape, the NAND type flash memory is suited to miniaturization, whereby a flash memory of large capacity is achieved.

Incidentally, due to progress in miniaturization of the memory cell in the NAND type flash memory, deterioration of data holding characteristics of the memory cell has become a problem. Specifically, data holding characteristics tend to deteriorate when the cumulative number of times of executions of a write operation/erase operation to the memory cell increases causing progressive deterioration of a gate insulating film of the memory cell. Therefore, sometimes, after completion of the write operation and a write verify operation, a lower limit of the threshold voltage distribution falls to a write verify voltage or less, which leads to deterioration of data holding characteristics of the memory cell.

BRIEF DESCRIPTION OF THE DRAWINGS

FIG. 2 shows an example of a data write method in the case of executing a four-level data storage scheme in the NAND cell type flash memory of the first embodiment.

FIG. 3 is a flowchart showing a procedure in the case of executing the write method of FIG. 2.

DETAILED DESCRIPTION

A nonvolatile semiconductor memory device of an embodiment described below comprises a memory cell array having NAND cell units arranged therein, each NAND cell unit configured from a memory string and a select transistor connected to both ends of the memory string, the memory string having a plurality of nonvolatile memory cells connected in series therein, the memory cell including a charge storage layer formed on a semiconductor layer via a gate insulating film and a control gate formed on the charge storage layer via an inter-gate insulating film. Additionally, this nonvolatile semiconductor memory comprises: a word line connected to the control gate; a bit line electrically connected to one end of the NAND cell unit; a source line electrically connected to the other end of the NAND cell unit; and a control circuit that controls a voltage applied to the semiconductor layer, the control gate, the bit line, and the source line.

The control circuit is configured to, when performing a write verify operation for determining whether a write operation has been completed or not after finishing the write operation, temporarily raises, prior to execution of the write verify operation, a voltage of the bit line or the source line to a light erase voltage which is higher than a voltage applied to the bit line or the source line during the write verify operation.

Next, each of embodiments will be described in detail with reference to the drawings.

First Embodiment

Figure 1:
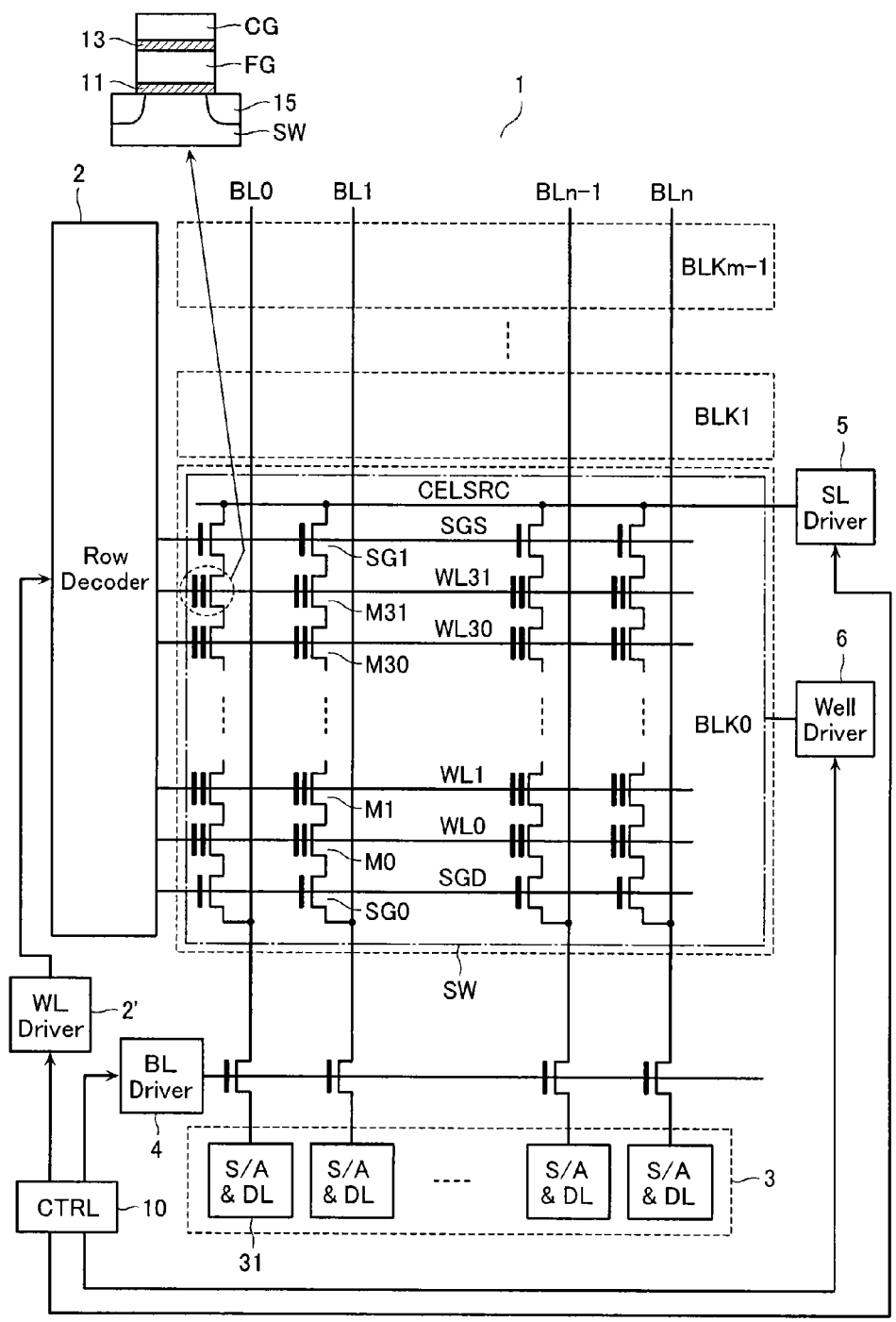
FIG. 1 is a circuit diagram explaining a memory core configuration of a NAND cell type flash memory according to a first embodiment.

First, a NAND cell type flash memory of a first embodiment will be described with reference to FIG. 1. FIG. 1 shows a memory core configuration of the NAND cell type flash memory according to the first embodiment.

A memory cell array 1 is configured to have memory strings MS arranged therein, each memory string MS having a plurality of 32 electrically rewritable nonvolatile memory cells M0-M31 connected in series therein. The number of memory cells M in one memory string MS is not limited to 32, and may also be set to, for example, 64, 128, and so on.

Connected to the two ends of the memory string MS are a drain side select gate transistor SG0 and a source side select gate transistor SG1 that are conductive when that memory string MS is selected. One NAND cell unit is configured by these 32 memory cells M0-M31 and select gate transistors SG0 and SG1.

The memory cell M may be configured as a floating gate type memory cell of a type that has a floating gate FG (charge storage layer) formed via a gate insulating film 11 on a p type well SW formed on a semiconductor substrate, and includes a control gate CG on this floating gate FG via an inter-gate insulating film 13. Moreover, the plurality of memory cells M connected in series in one memory string MS share a drain/source diffusion layer 15. The memory cell M, instead of being configured as a floating gate type memory cell, may also be configured as a MONOS type memory cell including a charge storage layer configured from, for example, a silicon nitride film, or the like.

Each NAND cell unit is connected to a bit line BL at an end of the drain side select gate transistor SG0, and is connected to a source line CELSRC at an end of the source side select gate transistor SG1.

Control gates of the memory cells M0-M31 in the NAND cell unit are respectively connected to different word lines WL0-WL31. The select gate transistors SG0 and SG1 are connected to select gate lines SGD and SGS that are parallel to the word lines WL0-WL31.

A row decoder 2 and a word line driver 2' are disposed for selecting and driving the word lines WL and the select gate lines SGD and SGS. Each bit line BL is connected to a sense amplifier-cum-data latch 31 in a sense amplifier circuit 3. The bit line BL is charged to a certain voltage during a read operation by a pre-charge circuit, not illustrated, included in the sense amplifier-cum-data latch 31. Moreover, a clamp transistor is connected between the bit line BL and the sense amplifier-cum-data latch 31, a gate voltage of this clamp transistor being controlled by a bit line driver 4.

Shown here is the case where the bit line BL is connected to the sense amplifier-cum-data latch 31 in a one-to-one correspondence, and in this case the memory cells selected by one word line form one page undergoing simultaneous write/read. However, it is also possible to adopt a scheme where, for example, adjacent even-numbered bit lines and odd-numbered bit lines share one sense amplifier-cum-data latch. In this case, half of the memory cells selected by one word line form a unit (one page) of simultaneous write/read.

A group of NAND cell units sharing word lines configures a block which is a unit of data erase. As illustrated, a plurality of blocks BLK0, BLK1, . . . , BLKm−1 are arranged in a direction of the bit line BL.

In addition, a source line driver 5 and a well driver 6 are provided as circuits for controlling a potential of the source line CELSRC and the well SW. The source line driver 5 and the well driver 6, in the case of executing negative sense scheme, raise a voltage of the source line CELSRC and the well SW to a voltage $V_{CELSRC}$ (>0) and a voltage $V_{well}$ ($V_{well}$>0, $V_{CELSRC} \geq V_{well}$), respectively. In order to avoid a substrate bias being applied, the voltage $V_{well}$ is set equal to the voltage $V_{CELSRC}$ or to a voltage which is smaller than $V_{CELSRC}$. A control circuit 10 controls these drivers 2', 4, 5, and 6 to control a voltage applied to the word line WL, the bit line BL, the source line CELSRC, and the well SW. Note that the voltage supplied to the word line WL, the bit line BL, the source line CELSRC, and the well SW is supplied from a voltage generating circuit 7. The voltage generating circuit 7 comprises a plurality of boost circuits CP. The voltage generating circuit 7 selectively operates several of these plurality of boost circuits (power source circuits) CP based on a control signal from the control circuit 10. Moreover, the voltage generating circuit 7 is configured capable of simultaneously supplying the voltage generated employing several of these plurality of boost circuits CP to the plurality of drivers 2', 4, 5, or 6. That is, the control circuit 10 of the present embodiment is configured capable of, in a certain case, supplying various kinds of drivers with an identical voltage employing identical boost circuits CP.

FIG. 2 shows an example of a data write method in the case of executing a four-level data storage scheme in the NAND cell type flash memory in this embodiment. In addition, FIG. 3 is a flowchart showing a procedure in the case of executing this write method. Four-level data is defined by, for example, a negative threshold voltage distribution (erase distribution) E in a lowest voltage level, and threshold voltage distributions A, B, and C in higher voltage levels than this threshold voltage distribution E.

In order to write this four-level data, first, all memory cells of a selected block are set to the lowest negative threshold voltage distribution E (data erase: step S11 in FIG. 3). This data erase is performed by providing a positive erase voltage Vera from the well driver 6 to the well SW where the memory cell array 1 is formed, and setting all word lines of the selected block to 0 V to cause electrons of the floating gates of all memory cells M to be released.

Next, a lower page write (Lower Page Program) is performed that writes some of the cells having the threshold voltage distribution E to an intermediate distribution LM (step S12 in FIG. 3). Then, a verify voltage is set to a voltage VLM (the voltage VLM is applied between gate and source of the selected memory cell M) to perform a verify operation for confirming completion of write to the intermediate distribution LM (step S13).

Then, an upper page write (Upper Page Program) that raises a threshold voltage from the threshold voltage distribution E to A, and also from the intermediate distribution LM to the threshold voltage distributions B and C is performed, and then voltages VA, VB, or VC acting as a verify voltage are employed to perform a verify operation (steps S14 and S15). After write to all of the threshold voltage distributions E to C has been completed in this way, a read operation is performed as required (step S16). In the read operation, a read voltage applied between gate and source of the selected memory cell M is set to read voltages RA, RB, and RC which are voltages between an upper limit and a lower limit of each of the threshold voltage distributions E to C. On the other hand, a read pass voltage $V_{READ}$ which is sufficiently larger than an upper limit value of the threshold voltage distribution C is applied between gate and source of an unselected memory cell. The read pass voltage $V_{READ}$ is a voltage capable of setting the memory cell M to a conductive state, irrespective of held data of the memory cell M.

The above data write is performed as an operation that provides a selected word line with a write voltage VPGM, provides an unselected word line with a write pass voltage Vpass, provides a bit line with, for example, a ground voltage Vss (in the case of "0" write where the threshold voltage is raised) or a power supply voltage Vdd (in the case of write prohibit where the threshold voltage is not raised), thereby selectively injecting electrons into the floating gate of the memory cell. That is, in the case of "0" write, the ground voltage Vss applied to the bit line BL is transferred to a channel of the NAND cell unit, and when the write voltage VPGM is provided, electrons due to a tunnel current are injected from the channel into the floating gate. On the other hand, in the case of "1" write (write prohibit), the NAND cell channel is charged to Vdd−Vt (Vt is a threshold voltage of the drain side select gate transistor SG0) to become floating, and when the write voltage VPGM is provided, the cell channel is boosted by capacitive coupling, whereby electron injection does not occur. Note that data write usually utilizes a step-up write scheme that raises the write voltage little by little every write cycle (write operation and write verify operation).

In the lower page write (write of the intermediate distribution LM), in order to set a lower limit of the threshold voltage of that intermediate distribution LM to not less than a certain voltage (verify voltage VLM), confirmation of a write state (verify operation) is performed. That is, by means of a write verify operation that provides the verify voltage VLM between the control gate (selected word line) and the source of the selected memory cell, a determination of write failure (fail) is made if the selected memory cell is brought into conduction, and a determination of write success (pass) is made if the selected memory cell is not brought into conduction. Similarly, during upper page write, write verify operations of data states A, B, and C are performed by verify voltages VA, VB, and VC, respectively.

In a NAND cell type flash memory, due to progress in miniaturization, multi-leveling, and so on, of the memory cell, a voltage value of the threshold voltage distribution E after executing the data erase operation is becoming an increasingly low value (negative value of large absolute value). In this case, when performing a write operation of data from an erase state threshold voltage distribution of such a low voltage value, the threshold voltage distribution after write sometimes does not become a positive voltage but is negative. FIG. 2 shows an example where a lower limit value of the threshold voltage distribution A is a negative value.

In this case, a voltage of negative value must be provided between gate and source of the selected memory cell Mn during the verify operation, but preparing a voltage generating circuit capable of providing a voltage of negative value to the control gate of the memory cell leads to an increase in circuit area. Therefore, the nonvolatile semiconductor memory device of the present embodiment is configured capable of executing a so-called negative sense scheme.

Figure 4:
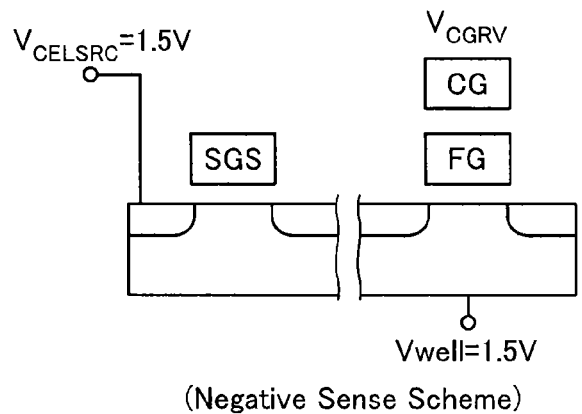
FIG. 4 is a conceptual diagram of a so-called negative sense scheme.

In the negative sense scheme, the voltages $V_{CELSRC}$ and $V_{well}$ applied to the source line CELSRC and the well SW during the read operation and during the write verify operation are set to a voltage of positive value, for example, a voltage of about 1.5 V (refer to FIG. 4). In this case, if, for example, the verify voltage VA of the threshold voltage distribution A is −1.5 V, it is sufficient for a voltage VCGRV applied to the control gate of the selected memory cell during the write verify operation of this threshold voltage distribution A to be 0 V (=−1.5+1.5). In this way, the negative sense scheme makes it unnecessary for the voltage applied to the control gate of the selected memory cell to be set to a negative voltage, even when the lower limit value of the threshold voltage distribution is set to a negative voltage.

Note that in the case where only the lower limit value of the threshold voltage distribution A is a negative value and the lower limit values of the other threshold voltage distributions B and C are positive values as in FIG. 2, the above-mentioned negative sense scheme may be adopted only in the verify operation and the read operation for the threshold voltage distribution A. That is, in the read operation for the threshold voltage distributions B and C, a configuration may be adopted executing an ordinary read scheme (positive sense scheme) that sets the voltages $V_{CELSRC}$ and $V_{well}$ to 0 V, without relying on the negative sense scheme. However, the negative sense scheme may be executed also for the threshold voltage distributions B and C.

Incidentally, in such a NAND type flash memory, progress in miniaturization of the memory cell has resulted in the following problem becoming significant, namely the problem that the more the cumulative number of times of executions of the write operation/erase operation to the memory cell increases, the more data holding characteristics of the memory cell deteriorate. This problem will be described with reference to FIG. 5.

Figure 5:
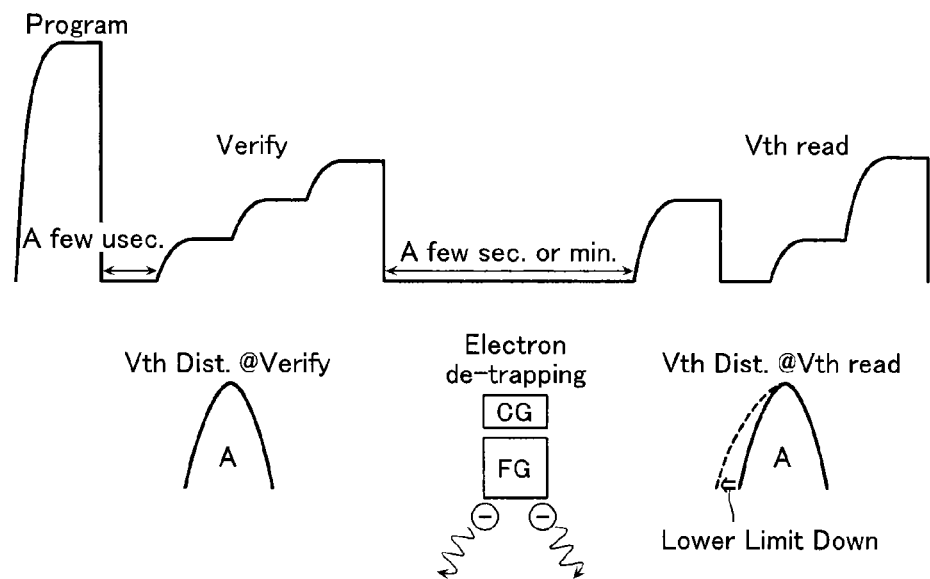
FIG. 5 is a schematic view showing a write operation, subsequent write verify operation, and further subsequent read operation, and problems at a time of those operations.

FIG. 5 is a schematic view showing the write operation, subsequent write verify operation, and further subsequent read operation, and problems at a time of those operations.

In the write operation (Program), the selected word line is applied with a high voltage of, for example, 20 V or more, whereby a charge corresponding to data is trapped in the floating gate of the memory cell M, and the threshold voltage distribution corresponding to data intended to be written is obtained in the selected memory cell. In the write verify operation (Verify) immediately after the write operation, the write verify voltage (VA, VB, and VC) is applied to the selected word line, and if, for example, the lower limit value of the threshold voltage distribution attains the write verify voltage or more, the write operation is determined to have been completed (a "pseudo-pass scheme" where the write operation is regarded as having been completed in the case that the number of memory cells determined to be write-incomplete is a certain value or less, is also sometimes adopted).

However, even when the lower limit value of the threshold voltage distribution is not less than the write verify voltage VA, VB, and VC immediately after the write operation is finished, it sometimes happens that when a few seconds or a few minutes have elapsed after the verify operation, trapped charge escapes from the memory cell causing the lower limit value of the threshold voltage distribution to change, whereby the lower limit value of the threshold voltage distribution changes to a value which is lower than the write verify voltage VA, VB, and VC. Such a phenomenon is becoming more significant with progress in miniaturization of the memory cell. Such a drop in the lower limit value of the threshold voltage distribution is caused not only by leak of charge trapped in the floating gate, but also by, for example, leak of charge trapped in the gate insulating film, a gate sidewall film, or the like, as time elapses. Such a drop in the lower limit value of the threshold voltage distribution may cause a misread during the read operation.

Accordingly, in the present embodiment, in the write verify operation after the write operation, the following operation is executed.

Figure 6:
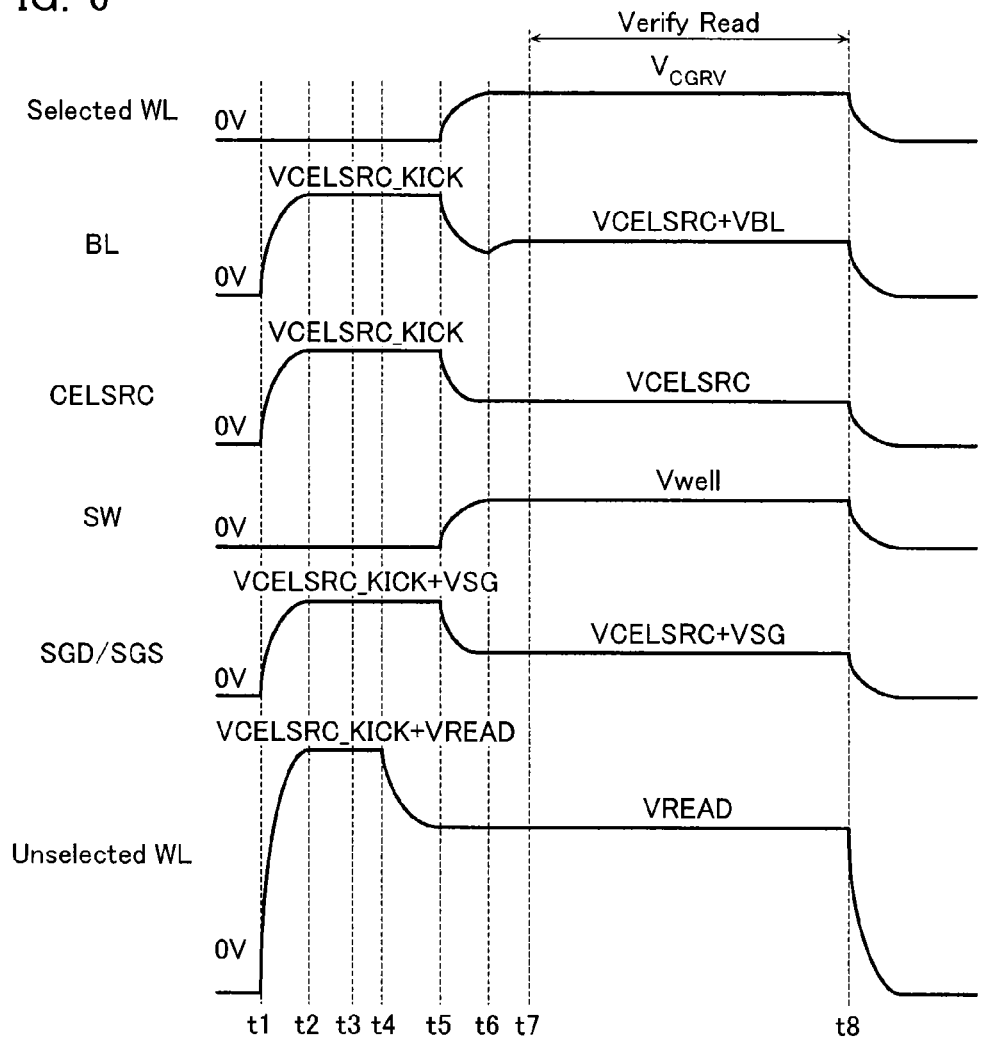
FIG. 6 is a timing chart showing a change in voltage applied to each part in the case of executing the write verify operation in the first embodiment.

FIG. 6 is a timing chart showing a change in voltage applied to each part in the case of executing the write verify operation in the first embodiment. Note that FIG. 6 describes the case where the so-called negative sense scheme is adopted (the voltages $V_{CELSRC}$ and $V_{well}$ applied the source line CELSRC and the well SW are set to a voltage of positive value), but a similar scheme may be adopted also in the case where the so-called positive sense scheme is adopted.

Figure 7:
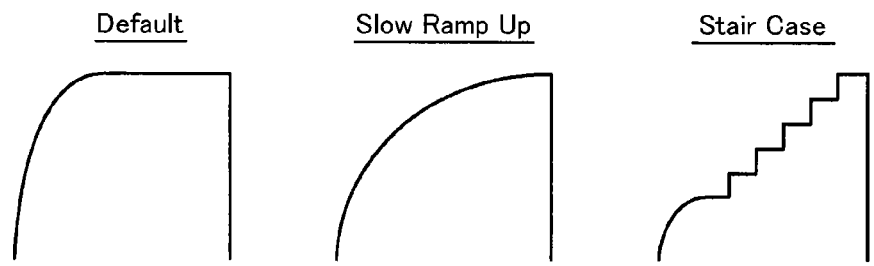
FIG. 7 shows an example of a voltage waveform applied in the write verify operation.

First, at time t1, a voltage of the bit line BL, a voltage of the source line CELSRC, and a voltage of an unselected word line WL are all raised to a voltage VCELSRC_KICK+VREAD. A read pass voltage VREAD is a voltage capable of rendering the memory cell conductive irrespective of held data of the memory cell, specifically, is a voltage larger than an upper limit value of the threshold voltage distribution C in FIG. 2. Moreover, this voltage VCELSRC_KICK is a voltage which is higher than a voltage applied to the source line CELSRC at time t7 when the write verify operation is actually started (voltage VCELSRC in the case of FIG. 6). As an example, when VCELSRC is about 1.5V, VCELSRC is a voltage of about 3-5 V. Note that a waveform during voltage rise of the bit line BL and the source line CELSRC may be a general waveform such as on the left side of FIG. 7, or may be a blunt waveform as in the center of FIG. 7. Moreover, a wave form rising in a stair case shape as on the right side of FIG. 7 is also possible.

In order to transfer to a channel the voltage VCELSRC_KICK applied to the bit line BL and the source line CELSRC, a voltage of the select gate lines SGD/SGS is raised to a voltage VCELSRC_KICK+VSG which is even higher than this voltage VCELSRC_KICK. Note that a voltage VSG is a threshold voltage of the select transistors SG0 and SG1.

On the other hand, a voltage of the well SW and a voltage of a selected word line WL are maintained at 0 V (ground potential) until time t5. Note that a voltage provided to the word line WL need not be 0 V, rather, need only be a voltage which is smaller than a light erase voltage VCELSRC_KICK.

At times t1-t5 in FIG. 6, the voltage of the selected word line WL is 0 V, while the channel is provided with the voltage VCELSRC_KICK, hence in a selected memory cell M, a light erase operation is performed based on a potential difference between this 0 V and the voltage VCELSRC_KICK (below, this operation is referred to as a "light erase operation". Moreover, the voltage VCELSRC_KICK is referred to as a "light erase voltage VCELSRC_KICK"). As a result, the previously mentioned charges trapped in the likes of the gate insulating film or the sidewall film, which are in a state where they can easily leak therefrom is released, whereby the lower limit value of the threshold voltage distribution lowers. If a write verify operation is performed in such a condition that such charges can easily leak therefrom but still remains trapped, it leads to an inaccurate verify determination result. Therefore, having such a light erase operation performed prior to the write verify operation is preferable in terms of performing an accurate verify determination.

Subsequently, at time t4, the unselected word line is lowered to the read pass voltage VREAD. Following this, at time t5, the voltage of the select gate lines SGD and SGS is lowered from the light erase voltage VCELSRC_KICK+VSG to a voltage VCELSRC+VSG. Furthermore, the voltages of the bit line BL and the source line CELSRC are lowered to VCELSRC+VBL and VCELSRC, respectively, and the voltage of the well SW is raised to a voltage Vwell. Moreover, the selected word line WL is applied with a voltage VCGRV that is the write verify voltage VA, VB, and VC to which the voltage VCELSRC is added. As a result, the write verify operation (Verify Read) is started. Note that VBL is a voltage provided to the bit line BL when the positive sense scheme is adopted.

Although omitted from the drawings, when the positive sense scheme is adopted, the voltages of the bit line BL and the source line CELSRC are lowered to the voltage VBL and 0 V, respectively, and the voltage of the well SW is maintained unchanged at 0 V. Even when the positive sense scheme is adopted, the operation at times t1-t5 is similar to that shown in FIG. 6.

As mentioned previously, at times t1-t5, the voltages of the source line CELSRC and the bit line BL are raised to the light erase voltage VCELSRC_KICK, whereby the above-mentioned light erase operation is performed. An ordinary erase operation performed to erase data of the memory cell is performed by providing the well SW with an erase voltage Vera (for example, 20 V or more). In contrast, the light erase operation of this embodiment is performed by providing the bit line BL and the source line CELSRC with the light erase voltage VCELSRC_KICK. The well SW has a parasitic capacitance which is far larger compared to that of the bit line BL or the source line CELSRC, hence requires time for charging, as a result of which the erase operation takes a long time compared to the write operation or read operation. However, this light erase operation is performed by providing the bit line BL and the source line CELSRC with the voltage VCELSRC_KICK. Therefore, the light erase operation can be performed in an extremely short time, for example, a time of about a few μs, whereby the lower limit value of the threshold voltage distribution can be adjusted and occurrence of misread can be suppressed, without lowering operation performance of the NAND type flash memory.

Note that in the above-described embodiment, the light erase operation is executed by providing both the bit line BL and the source line CELSRC with the light erase voltage VCELSRC_KICK. However, instead of this, it is also possible for the light erase operation to be performed by providing only the bit line BL or only the source line CELSRC with the light erase voltage VCELSRC_KICK.

Note that the unselected word line WL is applied with the voltage VCELSRC_KICK to avoid the light erase operation from being executed in the unselected word line WL. As long as the light erase operation is not executed, the unselected word line WL may be provided with a voltage different from the voltage VCELSRC_KICK. In other words, during times t1-t4, the unselected word line WL may be applied with a voltage which is larger than the voltage provided to the selected word line WL.

Second Embodiment

Figure 8:
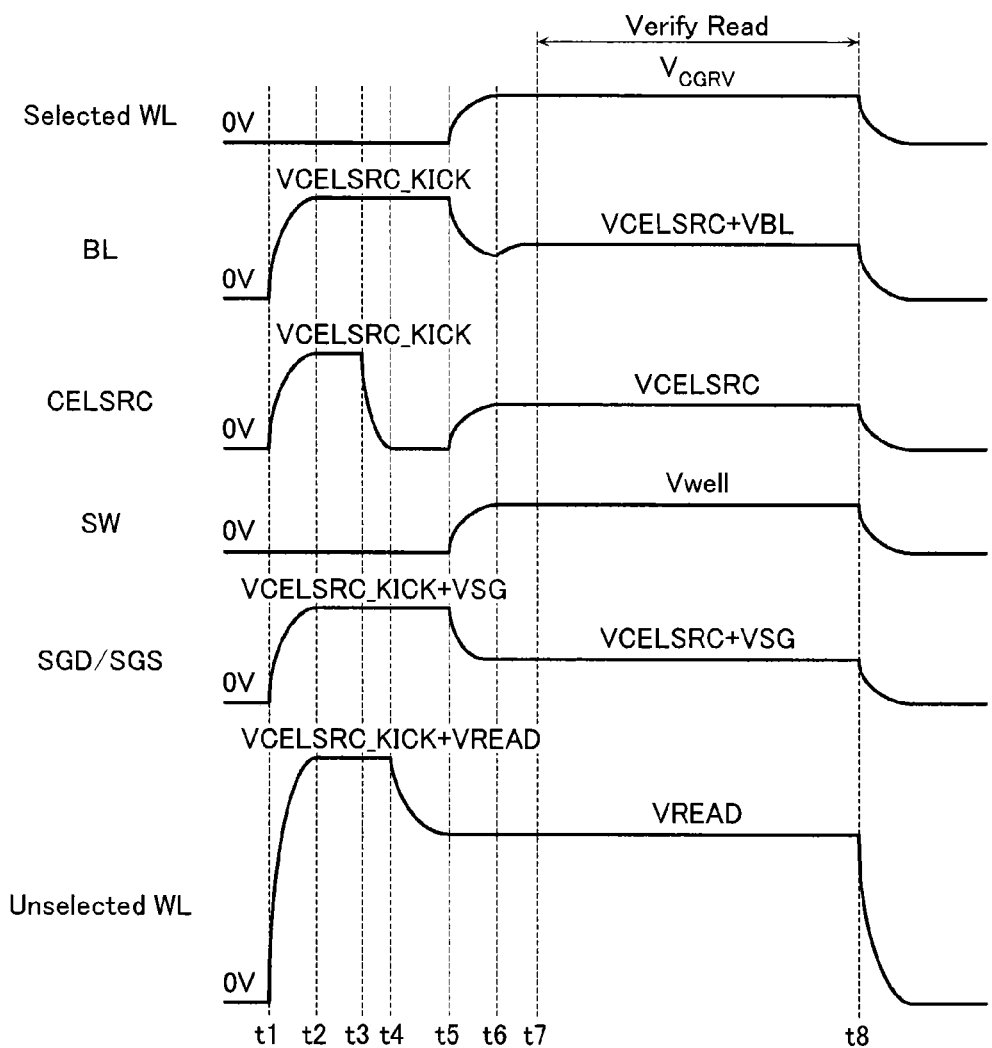
FIG. 8 is a timing chart showing a change in voltage applied to each part in the case of executing a write verify operation in a second embodiment.

Next, a nonvolatile semiconductor memory device according to a second embodiment will be described with reference to FIG. 8. An overall configuration and basic operation of this second embodiment are identical to those of the first embodiment, hence a duplicated explanation thereof is omitted. As shown in FIG. 8, this second embodiment has a method of applying voltages in the write verify operation which differs from that in the first embodiment. That is, in this second embodiment, the voltage of the source line CELSRC, after being raised to the light erase voltage VCELSRC_KICK at time t1, is once lowered to 0 V (ground potential) at time t3, and then, at time t5, is raised toward the voltage VCELSRC which is the voltage during the write verify operation.

When it is sufficient for the light erase operation to be of short duration, applying the light erase voltage VCELSRC_KICK for a longer time than necessary results in the threshold voltage distribution of the memory cell being lowered more than necessary and time taken for the write operation lengthening. In this second embodiment, by once returning the source line CELSRC to 0 V, the light erase operation on the selected memory cell can be finished promptly.

Note that when the positive sense scheme is adopted, the voltages of the bit line BL and the source line CELSRC are lowered to the voltage VBL and 0 V, respectively, and the voltage of the well SW is maintained unchanged at 0 V. This is similar to in the first embodiment.

Third Embodiment

Figure 9:
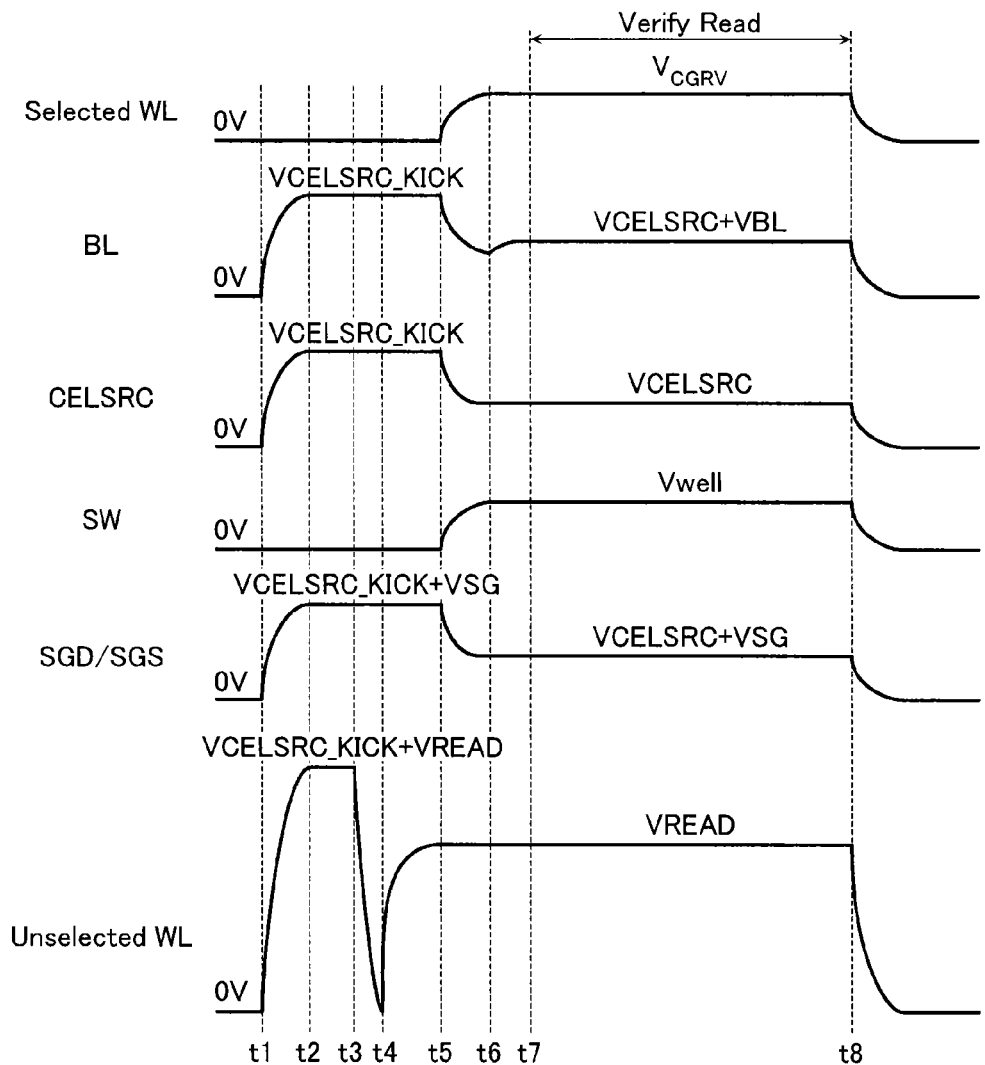
FIG. 9 is a timing chart showing a change in voltage applied to each part in the case of executing a write verify operation in a third embodiment.

Next, a nonvolatile semiconductor memory device according to a third embodiment will be described with reference to FIG. 9. An overall configuration and basic operation of this third embodiment are identical to those of the first embodiment, hence a duplicated explanation thereof is omitted. As shown in FIG. 9, this third embodiment has a method of applying voltages in the write verify operation which differs from that in the first embodiment. That is, in this third embodiment, the voltage of the unselected word line WL, after being raised to VCELSRC_KICK+VREAD at time t1, is once lowered to 0 V (ground potential) at time t3, and then, at time t4, is raised toward the read pass voltage VREAD. As a result, a voltage application time of the voltage VCELSRC_KICK+VREAD to the unselected word line WL is shortened, hence the probability of occurrence of miswrite to a memory cell connected to the unselected word line WL due to the voltage VCELSRC_KICK+VREAD is reduced compared to in the other embodiments.

Note that when the positive sense scheme is adopted, the voltages of the bit line BL and the source line CELSRC are lowered to the voltage VBL and 0 V, respectively, and the voltage of the well SW is maintained unchanged at 0 V. This is similar to in the first embodiment.

Fourth Embodiment

Figure 10:
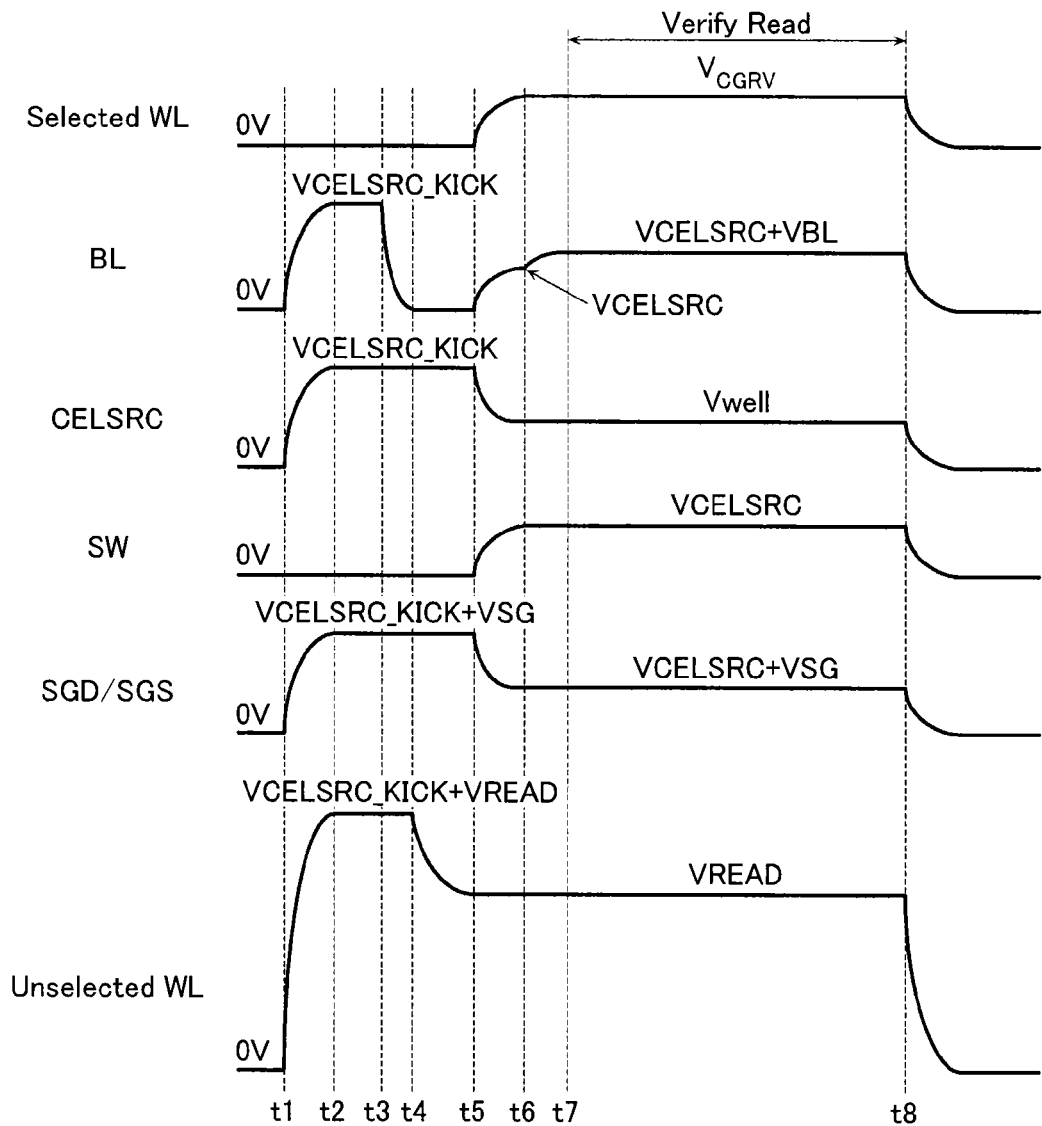
FIG. 10 is a timing chart showing a change in voltage applied to each part in the case of executing a write verify operation in a fourth embodiment.

Next, a nonvolatile semiconductor memory device according to a fourth embodiment will be described with reference to FIG. 10. An overall configuration and basic operation of this fourth embodiment are identical to those of the first embodiment, hence a duplicated explanation thereof is omitted. As shown in FIG. 10, this fourth embodiment has a method of applying voltages in the write verify operation which differs from that in the first embodiment. That is, in this fourth embodiment, the voltage of the bit line BL, after being raised to the light erase voltage VCELSRC_KICK at time t1, is once lowered to 0 V (ground potential) at time t3, and then, at time t5, is raised toward the voltage VCELSRC which is the voltage during the write verify operation, and, at time t6, is further raised to the voltage VCELSRC+VBL.

As a result, identical advantages to those of the second embodiment can be obtained.

Modified Examples

The above-described embodiments can be appropriately combined within a scope not departing from the spirit of the invention. For example, it is obviously also possible for the second embodiment and the fourth embodiment to be executed in combination.

Figure 11:
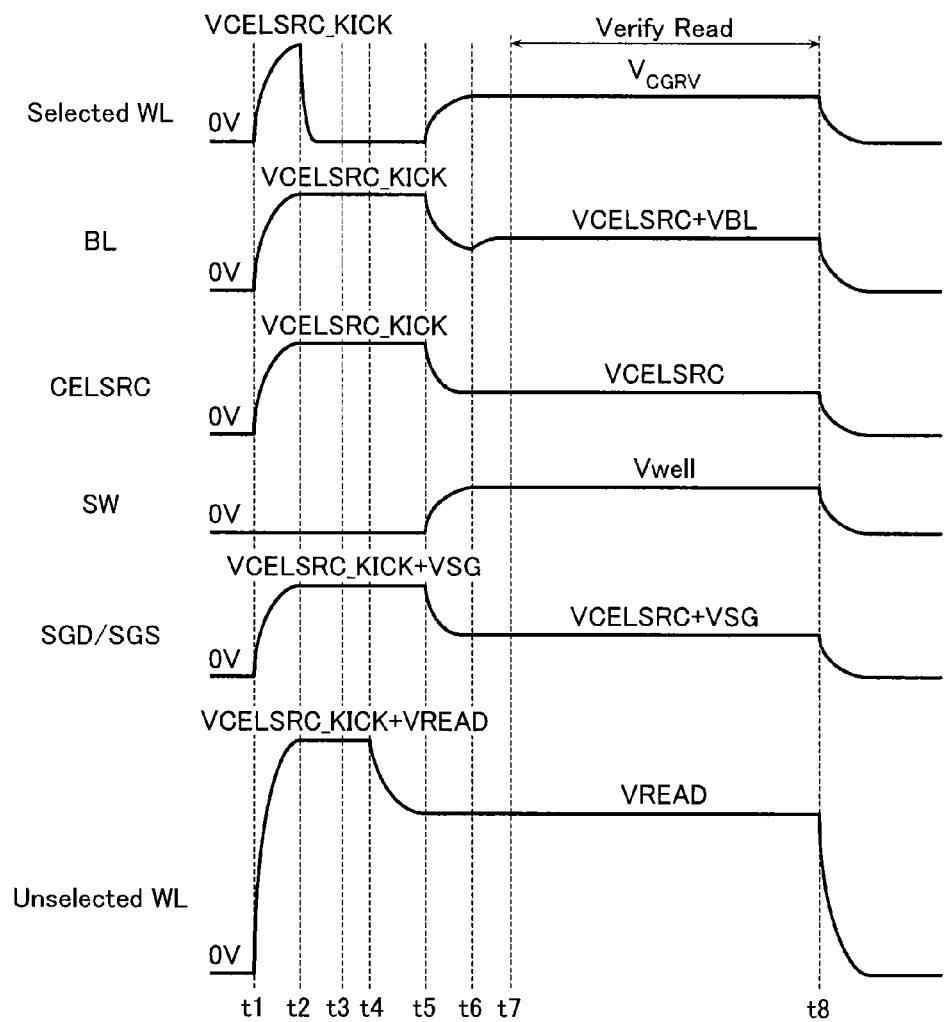
FIG. 11 shows a first modified example of the first embodiment.

FIG. 11 is a first modified example of the first embodiment. In this modified example, at time t1, the voltage of the selected word line WL is once raised to the voltage VCELSRC which is the same voltage as the bit line BL or source line CELSRC, and then, at time t2, is again returned to 0 V. This operation is effective for suppressing an excessive stress being applied to the selected memory cell by the abrupt application of voltages to the bit line BL and the source line CELSRC at time t1.

Figure 12:
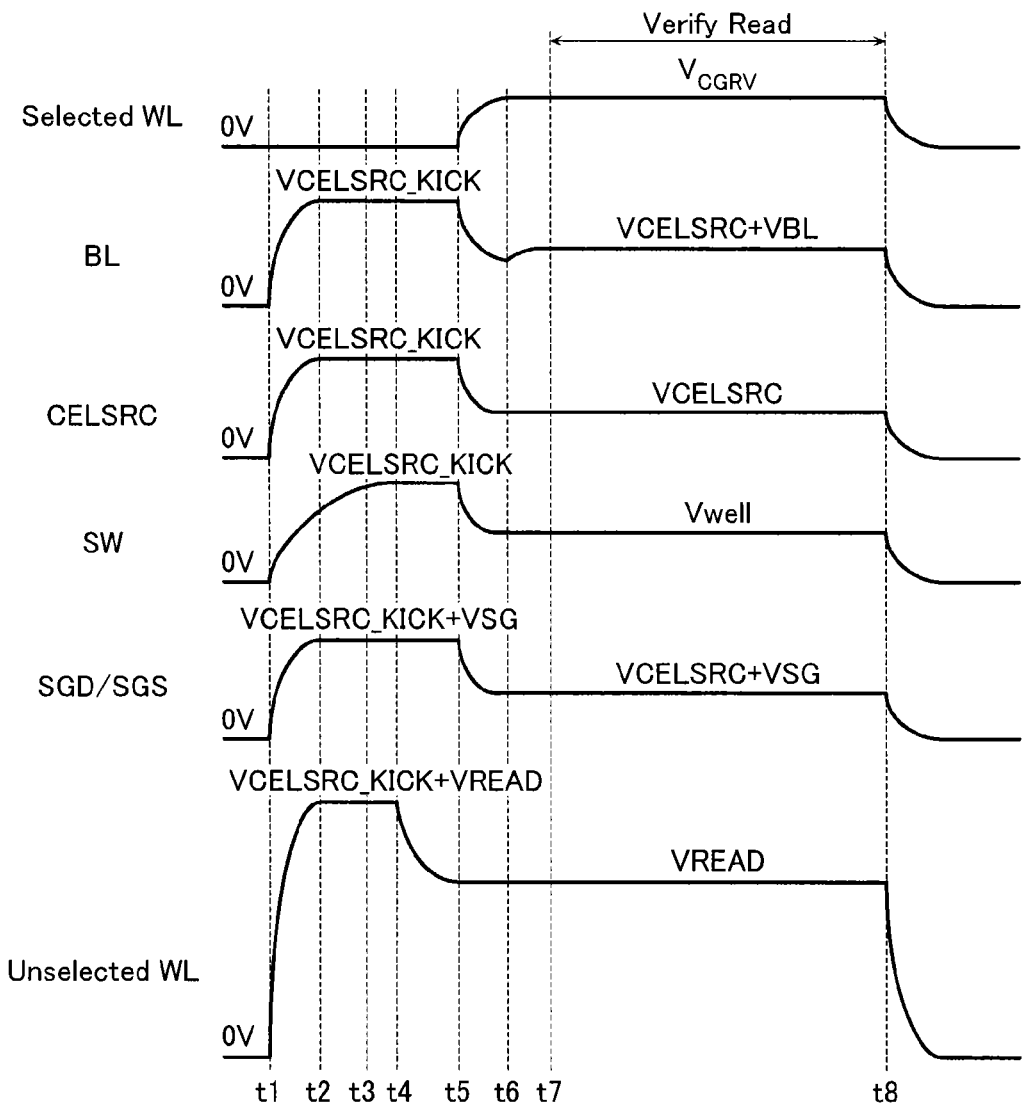
FIG. 12 shows a second modified example of the first embodiment.

In addition, FIG. 12 is a second modified example of the first embodiment. In this embodiment, at time t1, the voltage of the well SW is similarly raised to the voltage VCELSRC_KICK. This operation is effective in more reliably executing the above-described light erase operation.

These two modified examples may be adopted also in the other embodiments.

Other

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device, comprising:
   a memory cell array having NAND cell units arranged therein, each NAND cell unit configured from a memory string and a select transistor connected to both ends of the memory string, the memory string having a plurality of nonvolatile memory cells connected in series therein, the memory cell including a charge storage layer formed on a semiconductor layer via a gate insulating film and a control gate formed on the charge storage layer via an inter-gate insulating film;
   a word line connected to the control gate;
   a bit line electrically connected to one end of the NAND cell unit;
   a source line electrically connected to the other end of the NAND cell unit; and
   a control circuit that controls a voltage applied to the semiconductor layer, the control gate, the bit line, and the source line,
   the control circuit being configured to, when performing a write verify operation for determining whether a write operation has been completed or not after finishing the write operation,
   temporarily raise, prior to execution of the write verify operation, a voltage of the bit line or the source line to a light erase voltage which is higher than a voltage applied to the bit line or the source line during the write verify operation.

2. The nonvolatile semiconductor memory device according to claim 1, wherein
   while the bit line or the source line is being provided with the light erase voltage, the control circuit provides the word line connected to a selected memory cell in the write operation with a first voltage which is smaller than the light erase voltage.

3. The nonvolatile semiconductor memory device according to claim 2, wherein
   while the bit line or the source line is being provided with the light erase voltage, the control circuit provides the word line connected to an unselected memory cell other than the selected memory cell with a second voltage which is larger than the first voltage.

4. The nonvolatile semiconductor memory device according to claim 1, wherein
   the control circuit is configured to temporarily raise a voltage of a gate of the select transistor connected to the bit line or the source line to a voltage having a value of the light erase voltage to which a threshold voltage of the select transistor is added.

5. The nonvolatile semiconductor memory device according to claim 4, wherein
   while the bit line or the source line is being provided with the light erase voltage, the control circuit provides the word line connected to a selected memory cell in the write operation with a first voltage which is smaller than the light erase voltage.

6. The nonvolatile semiconductor memory device according to claim 5, wherein
   while the bit line or the source line is being provided with the light erase voltage, the control circuit provides the word line connected to an unselected memory cell other than the selected memory cell with a second voltage which is larger than the first voltage.

7. The nonvolatile semiconductor memory device according to claim 1, wherein
   the control circuit is configured to, after temporarily raising the voltage of the bit line or the source line to the light erase voltage, lower the voltage of the bit line or the source line to a ground potential, and then raise the voltage of the bit line or the source line to a voltage for executing the write verify voltage.

8. The nonvolatile semiconductor memory device according to claim 7, wherein
the control circuit, while the bit line or the source line is being provided with the light erase voltage, provides the word line connected to a selected memory cell in the write operation with a first voltage which is smaller than the light erase voltage.

9. The nonvolatile semiconductor memory device according to claim 8, wherein
while the bit line or the source line is being provided with the light erase voltage, the control circuit provides the word line connected to an unselected memory cell other than the selected memory cell with a second voltage which is larger than the first voltage.

10. The nonvolatile semiconductor memory device according to claim 7, wherein
the control circuit is configured to temporarily raise a voltage of a gate of the select transistor connected to the bit line or the source line to a voltage having a value of the light erase voltage to which a threshold voltage of the select transistor is added.

11. A method of controlling a nonvolatile semiconductor memory device,
the nonvolatile semiconductor memory device comprising:
a memory cell array having NAND cell units arranged therein, each NAND cell unit configured from a memory string and a select transistor connected to both ends of the memory string, the memory string having a plurality of nonvolatile memory cells connected in series therein, the memory cell including a charge storage layer formed on a semiconductor layer via a gate insulating film and a control gate formed on the charge storage layer via an inter-gate insulating film;
a word line connected to the control gate;
a bit line electrically connected to one end of the NAND cell unit; and
a source line electrically connected to the other end of the NAND cell unit,
the method comprising:
when performing a write verify operation for determining whether a write operation has been completed or not after finishing the write operation,
prior to execution of the write verify operation, raising a voltage of the bit line or the source line to a light erase voltage which is higher than a voltage applied to the bit line or the source line during the write verify operation, thereby raising a channel of the memory cell to the light erase voltage, and
after setting the voltage of the bit line or the source line to a certain voltage, executing the write verify operation.

12. The method according to claim 11, further comprising:
while the bit line or the source line is being provided with the light erase voltage, providing the word line connected to a selected memory cell in the write operation with a first voltage which is smaller than the light erase voltage.

13. The method according to claim 12, further comprising:
while the bit line or the source line is being provided with the light erase voltage, providing the word line connected to an unselected memory cell other than the selected memory cell with a second voltage which is larger than the first voltage.

14. The method according to claim 11, further comprising:
temporarily raising a voltage of a gate of the select transistor connected to the bit line or the source line to a voltage having a value of the light erase voltage to which a threshold voltage of the select transistor is added.

* * * * *